United States Patent
Lin et al.

(10) Patent No.: US 7,267,552 B2
(45) Date of Patent: Sep. 11, 2007

(54) SIGNAL TRANSMISSION CABLE WITH ADAPTIVE CONTACT PIN REFERENCE

(75) Inventors: Gwun-Jin Lin, Taoyuan (TW); Chih-Heng Chuo, Taoyuan (TW); Kuo-Fu Su, Taoyuan (TW)

(73) Assignee: Advanced Flexible Circuits Co., Ltd., Taoyuan (TW)

( * ) Notice: Subject to any disclaimer, the term of this patent is extended or adjusted under 35 U.S.C. 154(b) by 62 days.

(21) Appl. No.: 11/259,203

(22) Filed: Oct. 27, 2005

(65) Prior Publication Data
US 2007/0054519 A1    Mar. 8, 2007

(30) Foreign Application Priority Data
Sep. 2, 2005   (TW) .............................. 94130205 A

(51) Int. Cl.
*H01R 12/00*   (2006.01)

(52) U.S. Cl. ........................ 439/67; 439/77; 439/492; 439/498; 174/117 FF

(58) Field of Classification Search ................. 439/67, 439/77, 492–499, 580, 581; 174/117 FF
See application file for complete search history.

(56) References Cited

U.S. PATENT DOCUMENTS

| | | | | |
|---|---|---|---|---|
| 3,633,189 A | * | 1/1972 | Billawala | 360/245.8 |
| 5,779,498 A | * | 7/1998 | Asakawa | 439/495 |
| 5,917,149 A | * | 6/1999 | Barcley et al. | 174/378 |
| 6,753,477 B1 | * | 6/2004 | Sinkunas et al. | 174/117 FF |

* cited by examiner

*Primary Examiner*—X. Chung-Trans
(74) *Attorney, Agent, or Firm*—Rosenberg, Klein & Lee

(57) ABSTRACT

A signal transmission cable with adaptive contact pin reference structure includes a first cable having a connecting edge; a second cable having a connecting edge; a component lay-out section having a first lateral edge adjacent to the connecting edge of the first cable, and a second lateral edge; and an overlapping section having an inner lateral edge adjacent to the second lateral edge of said component lay-out section with a folding line formed between them, and an outer lateral edge adjacent to the connecting edge of the second cable with another folding line formed between them. Signal transmission lines included in the component lay-out section and the first cable are correspondingly connected with one another, and signal transmission lines included in the overlapping section are correspondingly connected to those included in the second cable and the component lay-out section.

11 Claims, 14 Drawing Sheets

SIGNAL TRANSMISSION CABLE WITH ADAPTIVE CONTACT PIN REFERENCE

FIELD OF THE INVENTION

The present invention relates to a signal transmission cable, and more particularly to a signal transmission cable with adaptive contact pin reference.

BACKGROUND OF THE INVENTION

A conventional cable includes a plurality of parallelly arranged insulated conductors, and is used in various kinds of electrical appliances, electronic apparatus, computers, and communication apparatus to transmit signals. While the conventional cable works well when being used between two fixed connecting elements, it could not be satisfactorily used with pivoting mechanisms.

However, pivoting mechanisms are often employed in many currently available electronic apparatus and communication apparatus. For example, the currently widely accepted mobile phones usually include a cover or a screen connected to a main unit of the mobile phone via a pivoting mechanism. At present, a miniaturized cable or a cluster of very fine conductors is used as a signal transmission cable to transmit electric signals from the main unit to the cover or the screen of the mobile phone.

While the miniaturized cable and the cluster of very fine conductors may be used as an alternative for transmitting signals via the mobile phone, they do not permit the pivoting elements for the cable or the cluster of fine conductors to be reduced in size. In other words, the large-size pivoting elements would form a limit in designing the main unit of the mobile phone.

On the other hand, more and more mobile phones or notebook computers are designed to transmit signals via pivoting elements, the sizes of the pivoting elements become smaller and smaller, and the pivoting mechanisms have developed from a simple one-dimensional structure to a two-dimensional structure. And, the conventional cable no longer meets these requirements. When the conventional cable is used with the existing size-reduced pivoting mechanism, it would adversely affect the operation of the pivoting mechanism. The conductors included in the cable tend to twist or tangle with one another during the operation of the pivoting mechanism. In a worse condition, some of the conductors in the cable would become damaged.

To overcome the above-mentioned problems, a clustered cable has been developed. While the clustered cable can be successfully extended through the hole on a pivot element, there is still a big problem in designing the contact pins at two ends of the cable for connecting to electronic components, such as connectors or soldering points. For example, in an original design of a circuit substrate for an electronic product, in the event the contact pins on the contactor are unchangeable, a cable with matched contact pins must be selected for use with the electronic product. When the contact pins on the cable and the circuit substrate are different from one another, problems would occur in the connection operation. As a result, cable manufacturers have to produce cables with different contact pins to meet different requirements. These cables with different contact pins not only increase the R&D and manufacturing costs, but also bring confusions to users.

SUMMARY OF THE INVENTION

A primary object of the present invention is to provide a signal transmission cable with adaptive contact pin reference. To achieve this object, the cable of the present invention can be folded in different manners to change the contact pin reference thereof to adapt to different signal transmission conditions.

Another object of the present invention is to provide a signal transmission cable with adaptive contact pin reference, so that a user may change the contact pin reference of the cable depending on actual need in use. The cable may also be supplied in different lengths and/or with different types of plug terminals for use with different electronic products.

A further object of the present invention is to provide a signal transmission cable with adaptive contact pin reference, so that the cable may be longitudinally folded and then connected at plug terminals thereof to one or two pin reference exchanged plates. The pin reference exchanged plate has a plurality of signal circuits formed thereon using known circuitry techniques, and may be a single-side board, a double-side board, or a multilayer board.

The signal transmission cable of the present invention may be applied to many electronic apparatus having a one-dimensional or a two-dimensional pivoting mechanism provided thereon, and has adaptive contact pin reference that can be adjusted to adapt to the electronic element to be connected to two ends of the cable. Therefore, the signal transmission cable of the present invention is highly flexible in use without being limited by the contact pins thereof.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
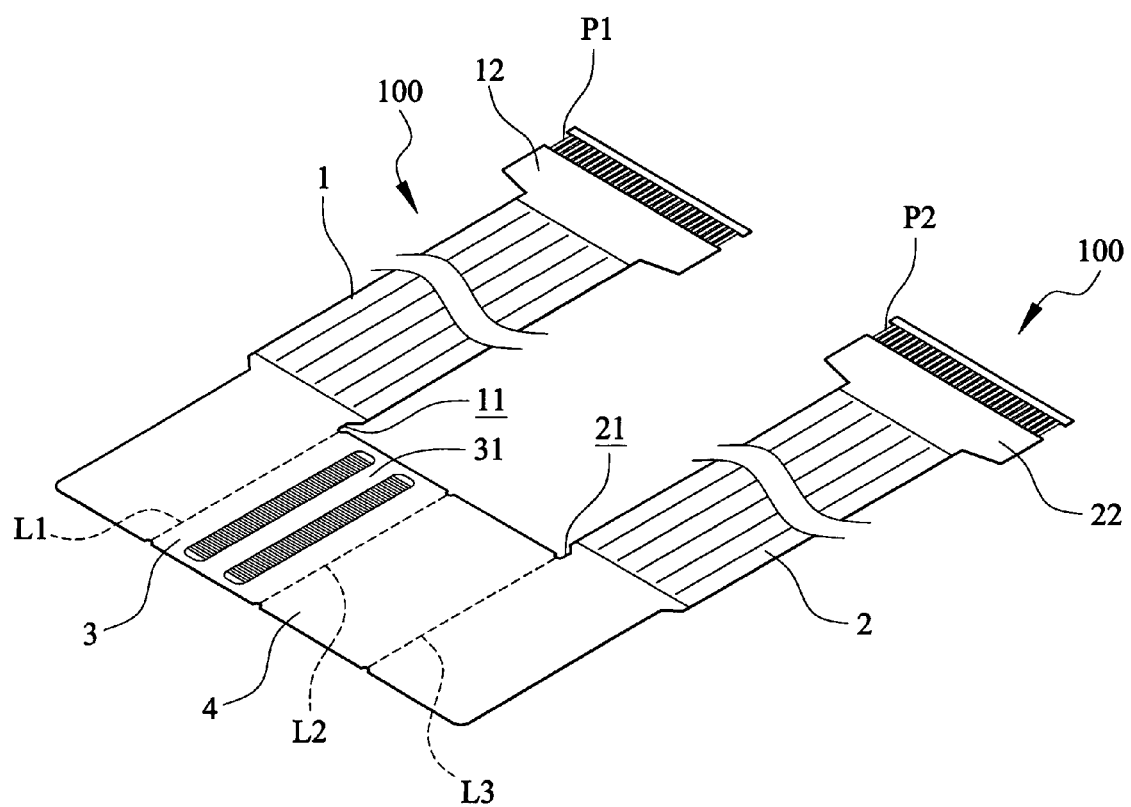
FIG. 1 is a developed perspective view of a signal transmission cable with adaptive contact pin reference according to a first embodiment of the present invention.
Figure 2:
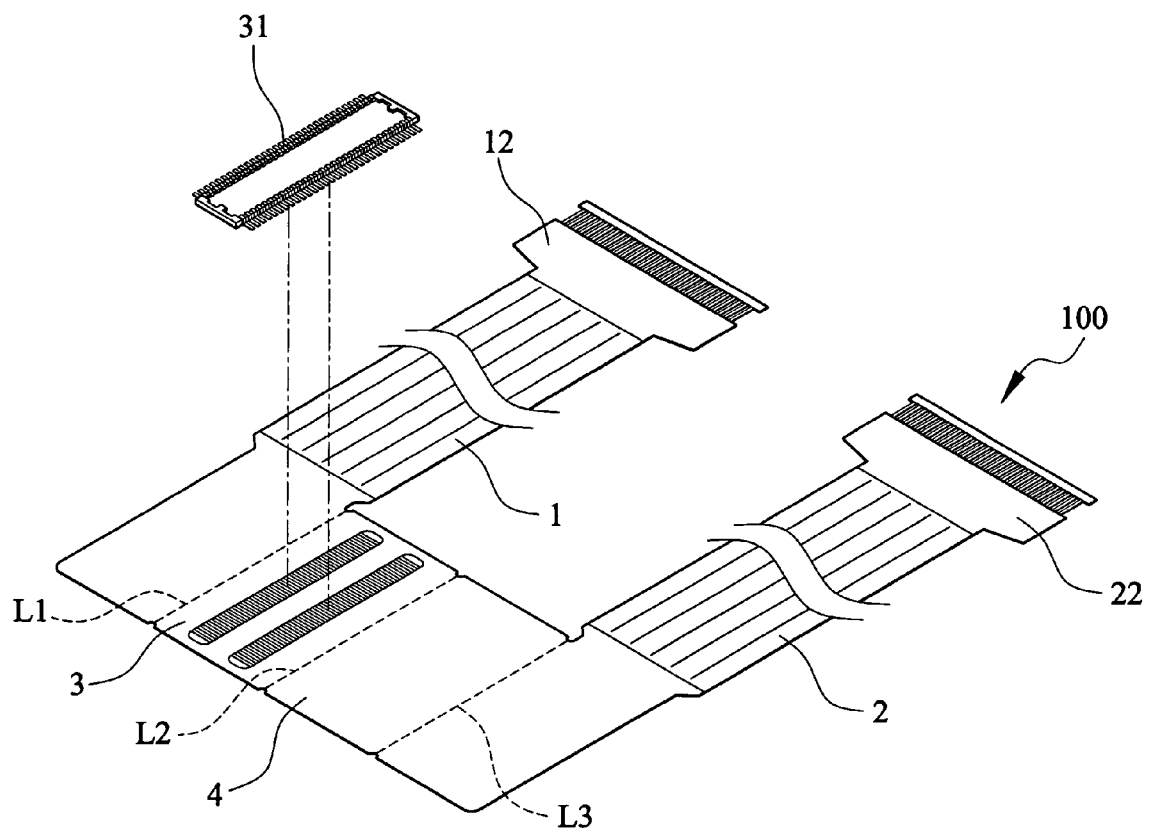
FIG. 2 is an exploded view of FIG. 1.
Figure 3:
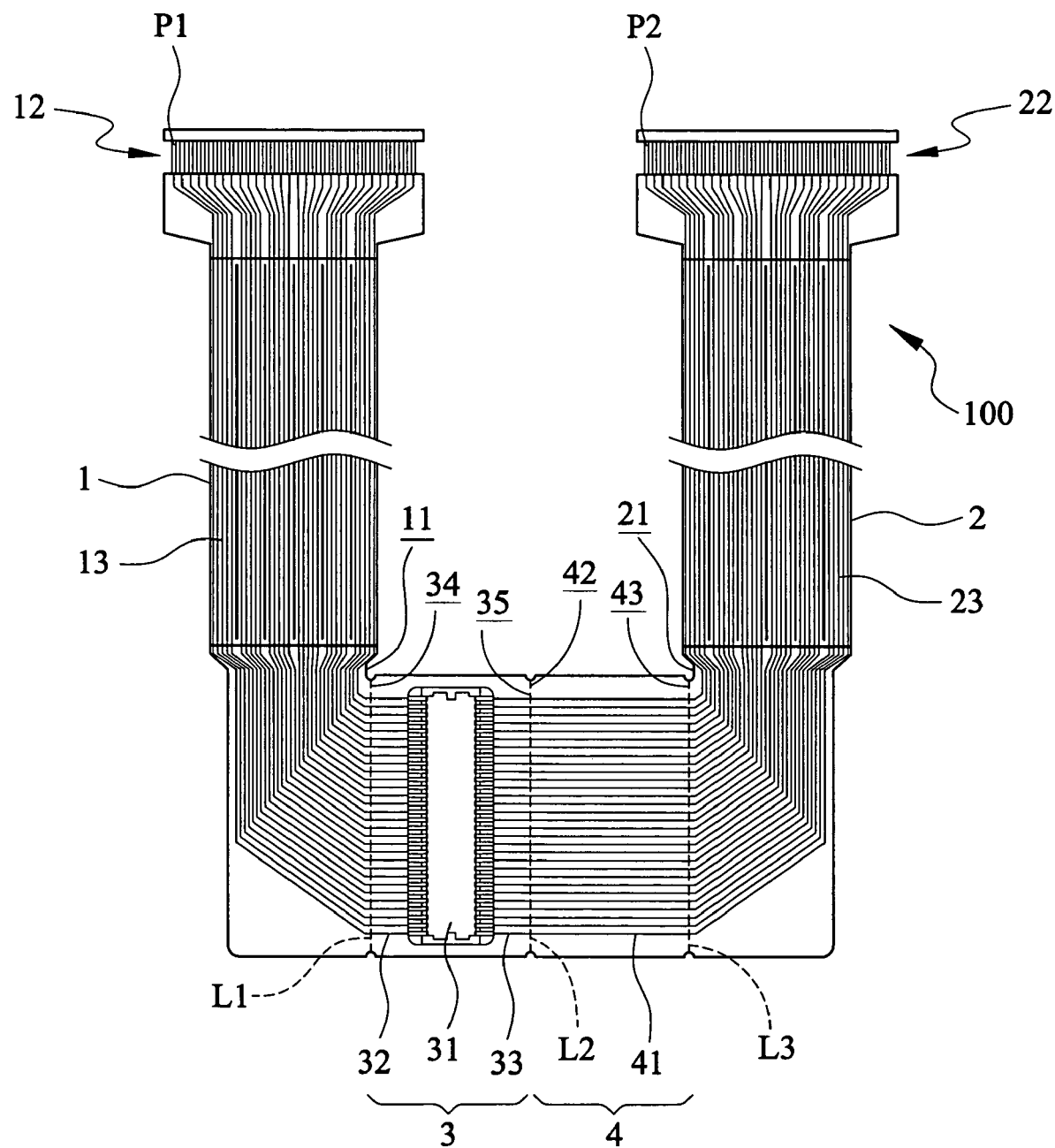
FIG. 3 is a plan view of FIG. 1.

Please refer to FIGS. 1, 2, and 3 that are developed perspective view, developed exploded perspective view, and developed plan view, respectively, of a signal transmission cable with adaptive contact pin reference 100 according to a first embodiment of the present invention.

As shown, the signal transmission cable 100 is produced using the soft circuit board technique, and includes two parallelly extended cables, namely, a first cable 1 and a second cable 2.

The first cable 1 has a connecting edge 11 and a plug terminal 12, and includes a plurality of signal transmission lines 13, as shown in FIG. 3. The plug terminal 12 may be a conventional golden finger plug terminal or a plug terminal with a relief contact section. The plug terminal 12 has a plurality of pins, and each of the pins has a predetermined number, such as pin 1 to pin 60. One of the pins is a first reference pin P1 used as identification.

The second cable 2 has a connecting edge 21 and a plug terminal 22, and includes a plurality of signal transmission lines 23. The plug terminal 22 may be a conventional golden finger plug terminal or a plug terminal with a relief contact section. The plug terminal 22 has a plurality of pins, and each of the pins has a predetermined number. One of the pins is a first reference pin P2 used as identification.

The signal transmission cable 100 also includes a component lay-out section 3, on a surface of which a component connection zone 31 is provided for a connector to connect thereto. The component lay-out section 3 may be arranged in a longitudinal direction as shown in the illustrated drawings, or in a transverse direction normal to the extending direction of the cable 100. A plurality of signal transmission lines 32, 33 are included in the component lay-out section 3 at two sides of the component connection zone 31 to electrically connect to the component connection zone 31.

The component lay-out section 3 has a first lateral edge 34 and a second lateral edge 35. The first lateral edge 34 of the component lay-out section 3 and the connecting edge 11 of the first cable 1 are adjacent to each other with a folding line L1 formed between them. The signal transmission lines 32 of the component lay-out section 3 are correspondingly connected with the signal transmission lines 13 of the first cable 1.

The signal transmission cable 100 further includes an overlapping section 4, on a surface of which a plurality of signal transmission lines 41 are arranged. The overlapping section 4 has an inner lateral edge 42 and an outer lateral edge 43. The inner lateral edge 42 of the overlapping section 4 and the second lateral edge 35 of the component lay-out section 3 are adjacent to each other with a folding line L2 formed between them. The outer lateral edge 43 of the overlapping section 4 and the connecting edge 21 of the second cable 2 are adjacent to each other with a folding line L3 formed between them. The signal transmission lines 41 of the overlapping section 4 are correspondingly connected at two ends with the signal transmission lines 23 of the second cable 2 and the signal transmission lines 33 of the component lay-out section 3.

In the first embodiment of the present invention, the first cable 1, the second cable 2, the component lay-out section 3, and the overlapping section 4 of the signal transmission cable 100 are provided on a single-layer substrate. However, it is understood the present invention may also be applied to a signal transmission cable formed of a two-layer or a multi-layer substrate.

Figure 4:
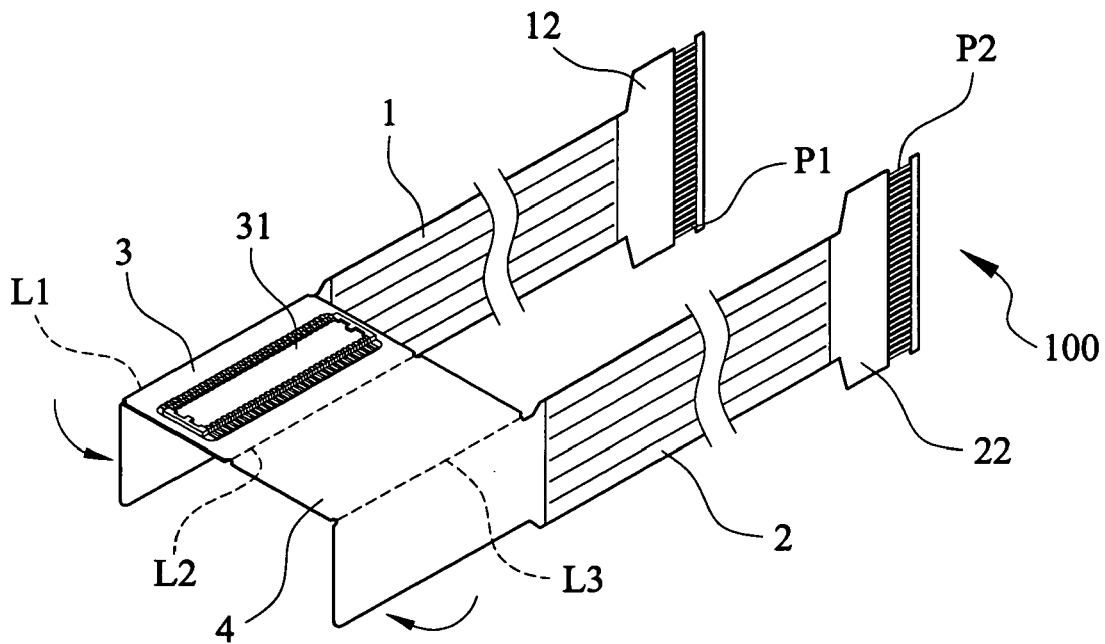
FIGS. 4, 5, and 6 are perspective views showing a first manner of folding the signal transmission cable of FIG. 1.
Figure 5:
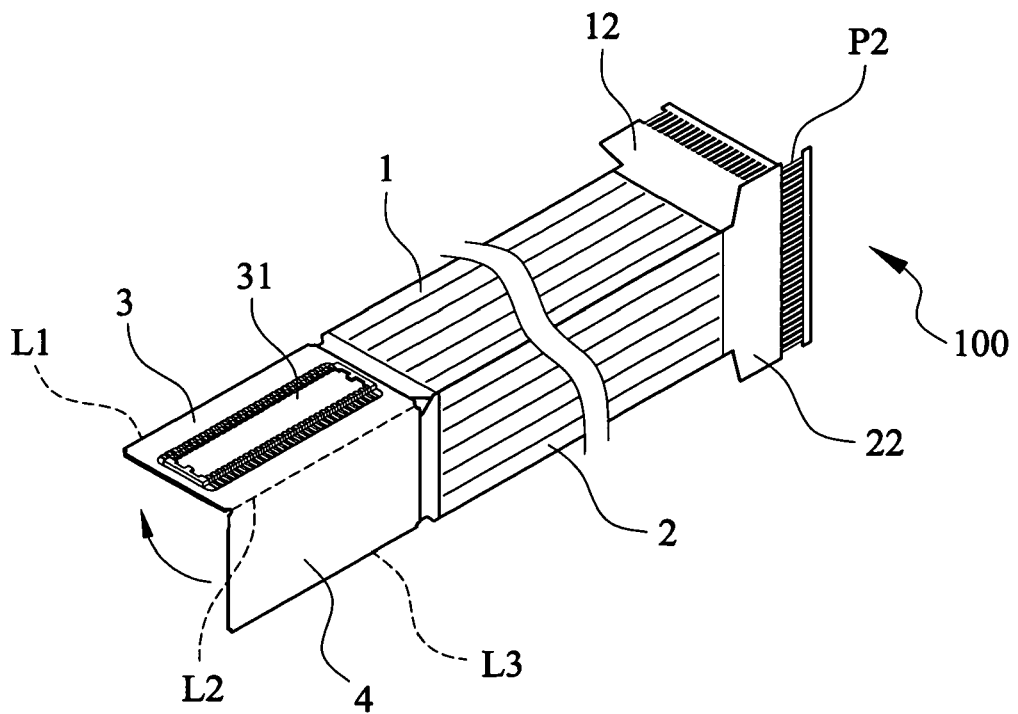
Figure 6:
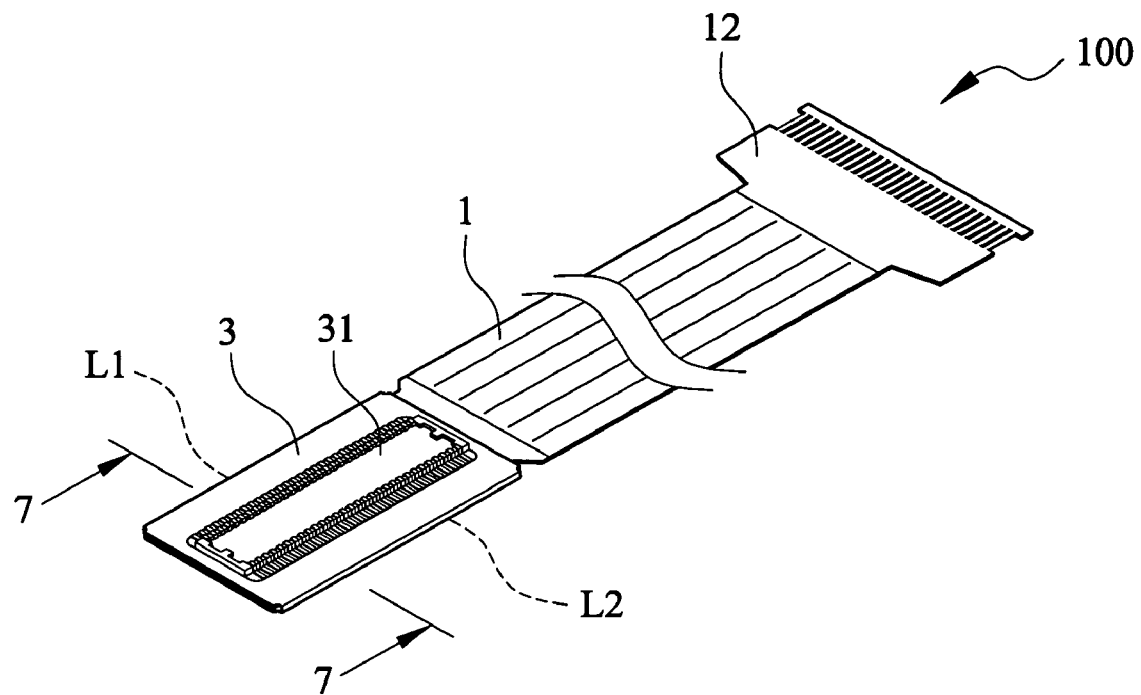
Figure 7:
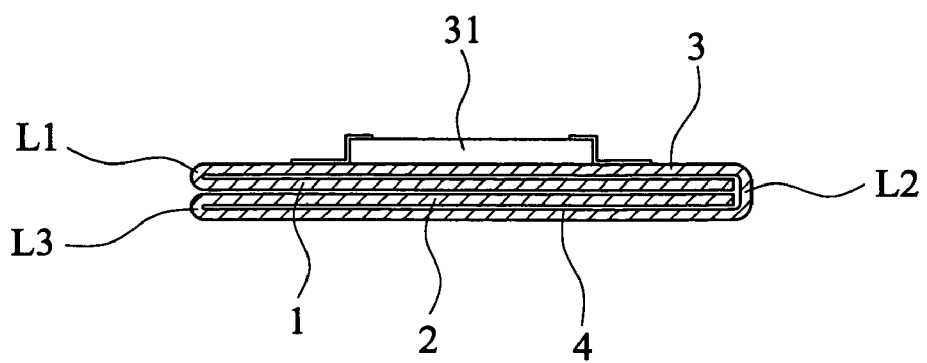
FIG. 7 is a sectional view taken along line 7—7 of FIG. 6.

FIGS. 4 to 6 are perspective view showing a first manner of folding the signal transmission cable 100. First, bend the cable 100 along the folding line L1 to turn and locate the first cable 1 below the component lay-out section 3, as shown in FIG. 4. Then, bend the cable 100 along the folding line L3 to turn and locate the second cable 2 below the overlapping section 4, as shown in FIG. 5. Finally, bend the cable 100 along the folding line L2 to turn and locate the overlapped second cable 2 and overlapping section 4 below the first cable 1 that has been turned and located below the component lay-out section 3, as shown in FIG. 6. And, a fully folded signal transmission cable 100 is completed. FIG. 7 is a sectional view taken along line 7—7 of FIG. 6.

In the signal transmission cable 100 fully folded in the first manner, the first cable 1 is located above the second cable 2, and the reference pin P1 on the first cable 1 and the reference pin P2 on the second cable 2 are correspondingly located at two opposite sides of the fully folded signal transmission cable 100.

Figure 8:
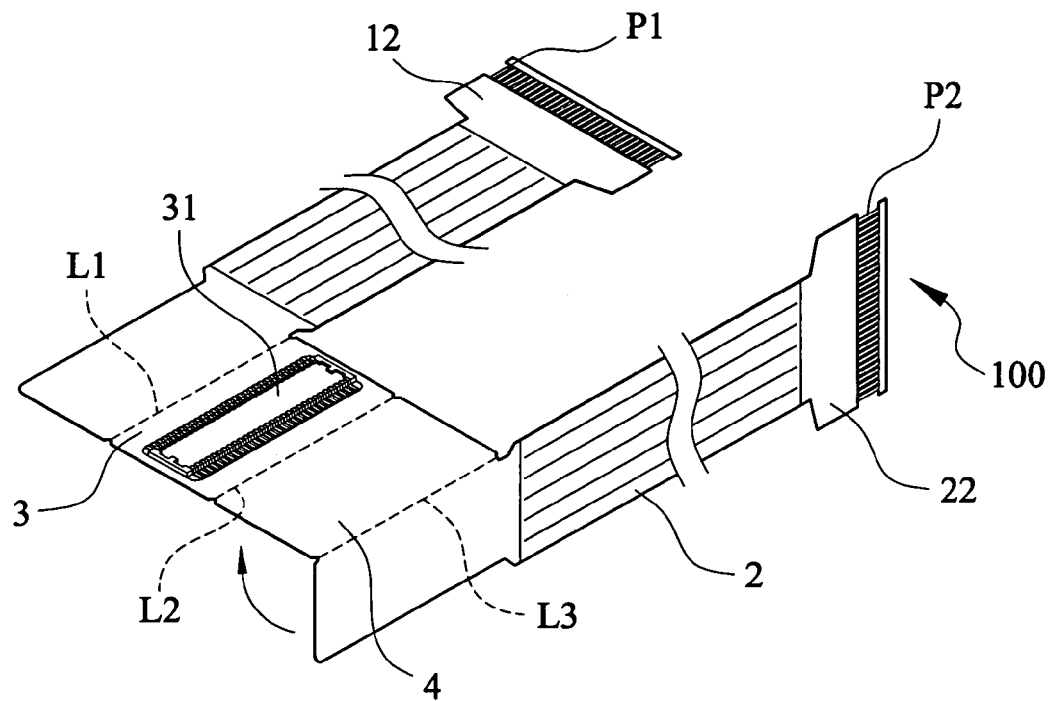
FIGS. 8, 9, and 10 are perspective views showing a second manner of folding the signal transmission cable of FIG. 1.
Figure 9:
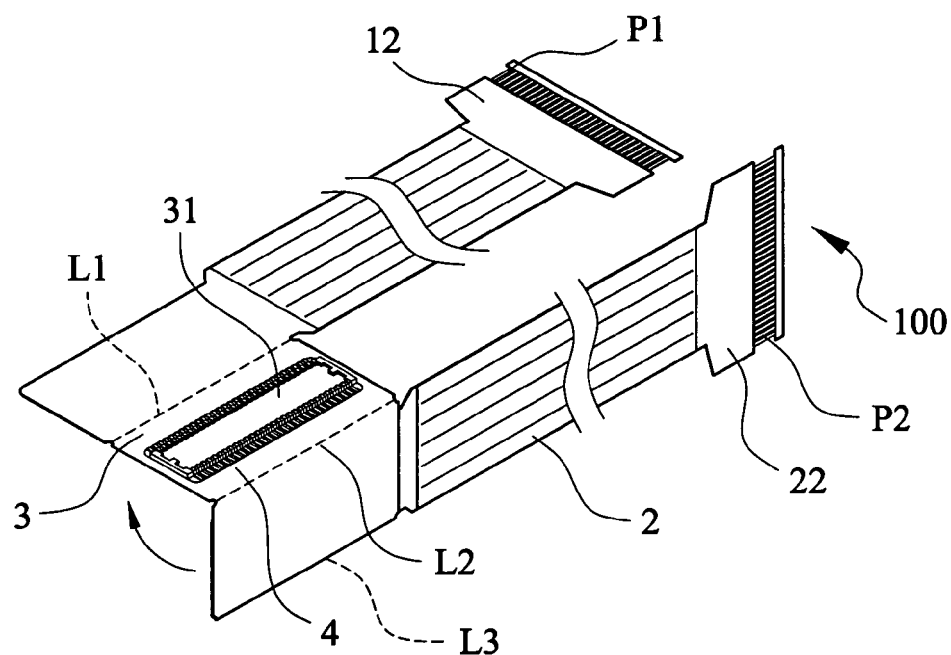
Figure 10:
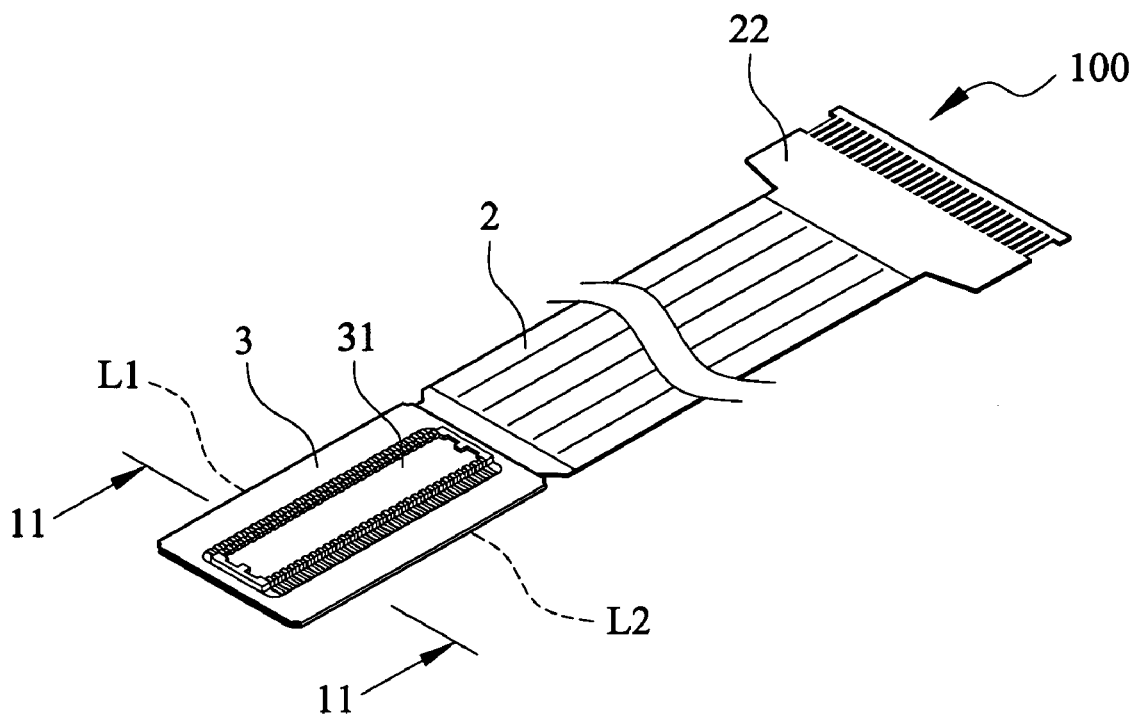
Figure 11:
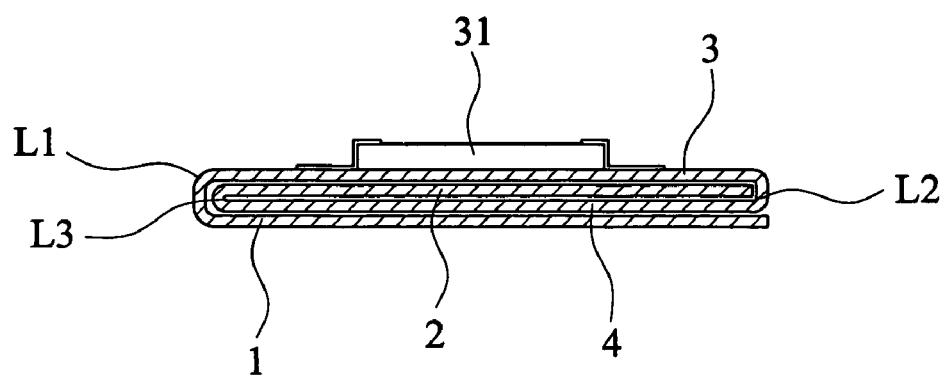
FIG. 11 is a sectional view taken along line 11—11 of FIG. 10.

FIGS. 8 to 10 are perspective views showing a second manner of folding the signal transmission cable 100. First, bend the cable 100 along the folding line L3 to turn and locate the second cable 2 below the overlapping section 4, as shown in FIG. 8. Then, bend the cable 100 along the folding line L2 to turn and locate the overlapped second cable 2 and overlapping section 4 below the component lay-out section 3, as shown in FIG. 9. Finally, bend the cable 100 along the folding line L1 to turn and locate the first cable 1 below the second cable 2 that has been turned and located below the component lay-out section 3, as shown in FIG. 10. And, a fully folded signal transmission cable 100 is completed. FIG. 11 is a sectional view taken along line 11—11 of FIG. 10.

In the signal transmission cable 100 fully folded in the second manner, the first cable 1 is located below the second cable 2, and the reference pin P1 on the first cable 1 and the reference pin P2 on the second cable 2 are correspondingly located at two opposite sides of the fully folded signal transmission cable 100.

Figure 12:
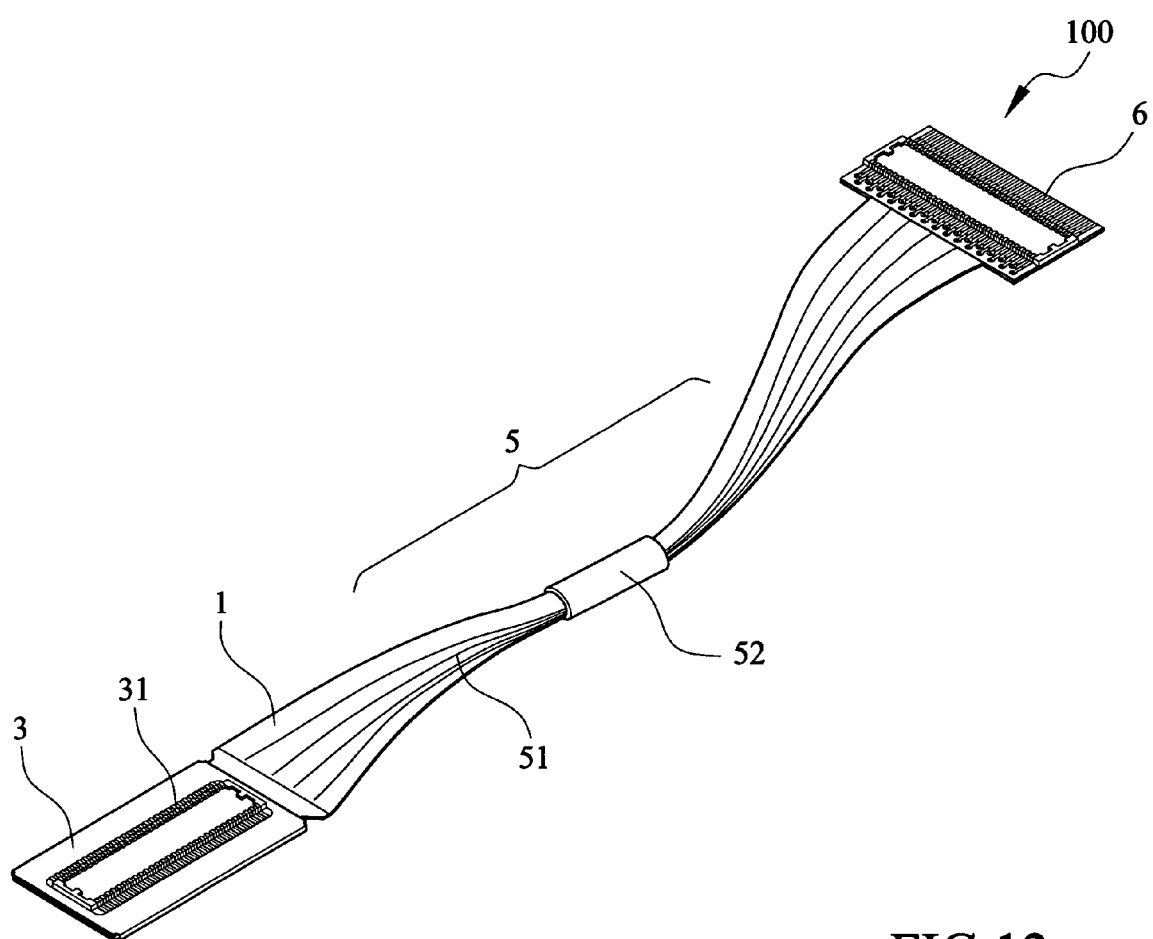
FIG. 12 is a perspective view of the signal transmission cable of FIG. 1 provided with a cluster section.

Please refer to FIG. 12. In the signal transmission cable 100 according to the first embodiment of the present invention, the first cable 1 and/or the second cable 2 may be provided with one single cluster section 5. The cluster section 5 includes a plurality of clustered cables, which are formed by cutting the first cable 1 and/or the second cable 2 along a plurality of paralleled cutting lines 51 extended in the lengthwise direction of the cables 1 and 2. Every clustered cable is independently freely bendable, and internally includes at least one signal transmission line. The cluster section 5 is protectively bound with a protective binding material 52. The plug terminals 12, 22 of the first and the second cable 1, 2, respectively, are then connected to a common connector 6.

Figure 13:
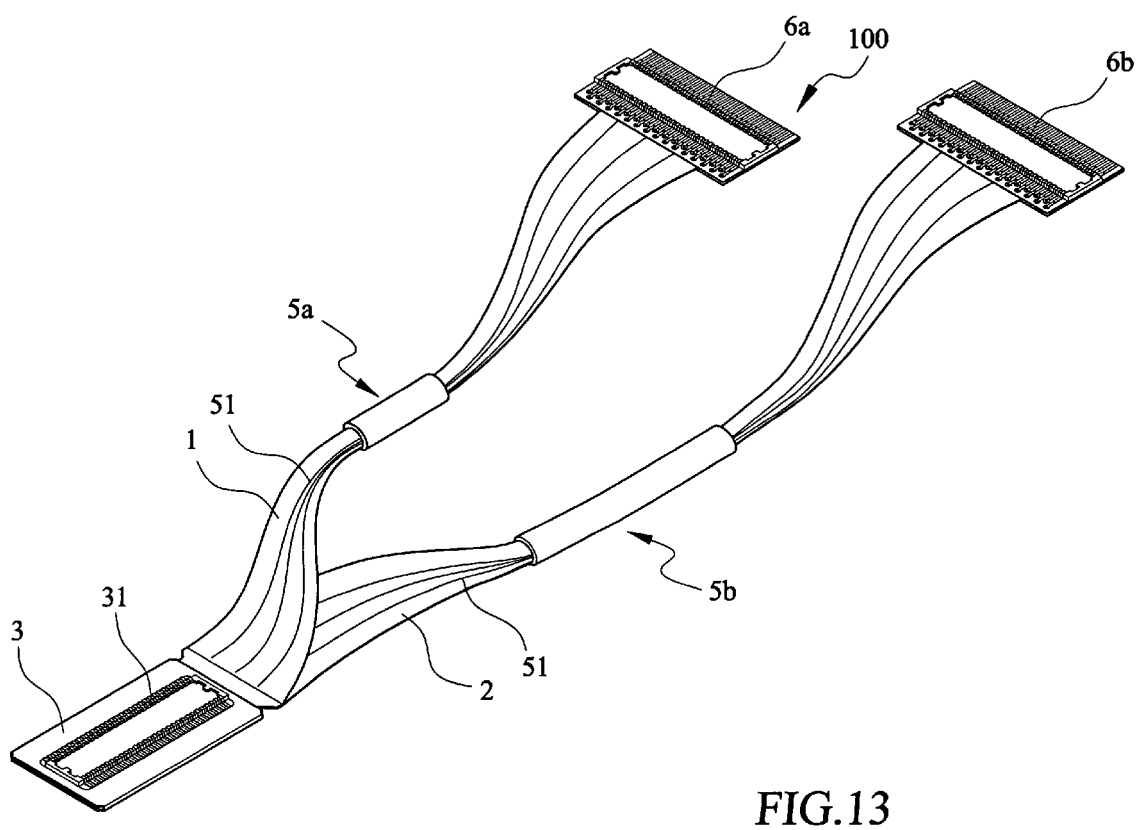
FIG. 13 is a perspective view of the signal transmission cable of FIG. 1 provided with two cluster sections and having two connectors connected to two plug terminals thereof.

Alternatively, the first and the second cable 1, 2 may have a cluster section each, as shown in FIG. 13. In this case, the cluster sections on the first cable 1 and the second cable 2 are protectively bound with protective binding materials 5a and 5b, respectively. And, the plug terminals 12, 22 of the first and the second cable 1, 2 are then connected to two connectors 6a and 6b, respectively. It is noted the first and the second cable 1, 2 may have different lengths or the same length.

Figure 14:
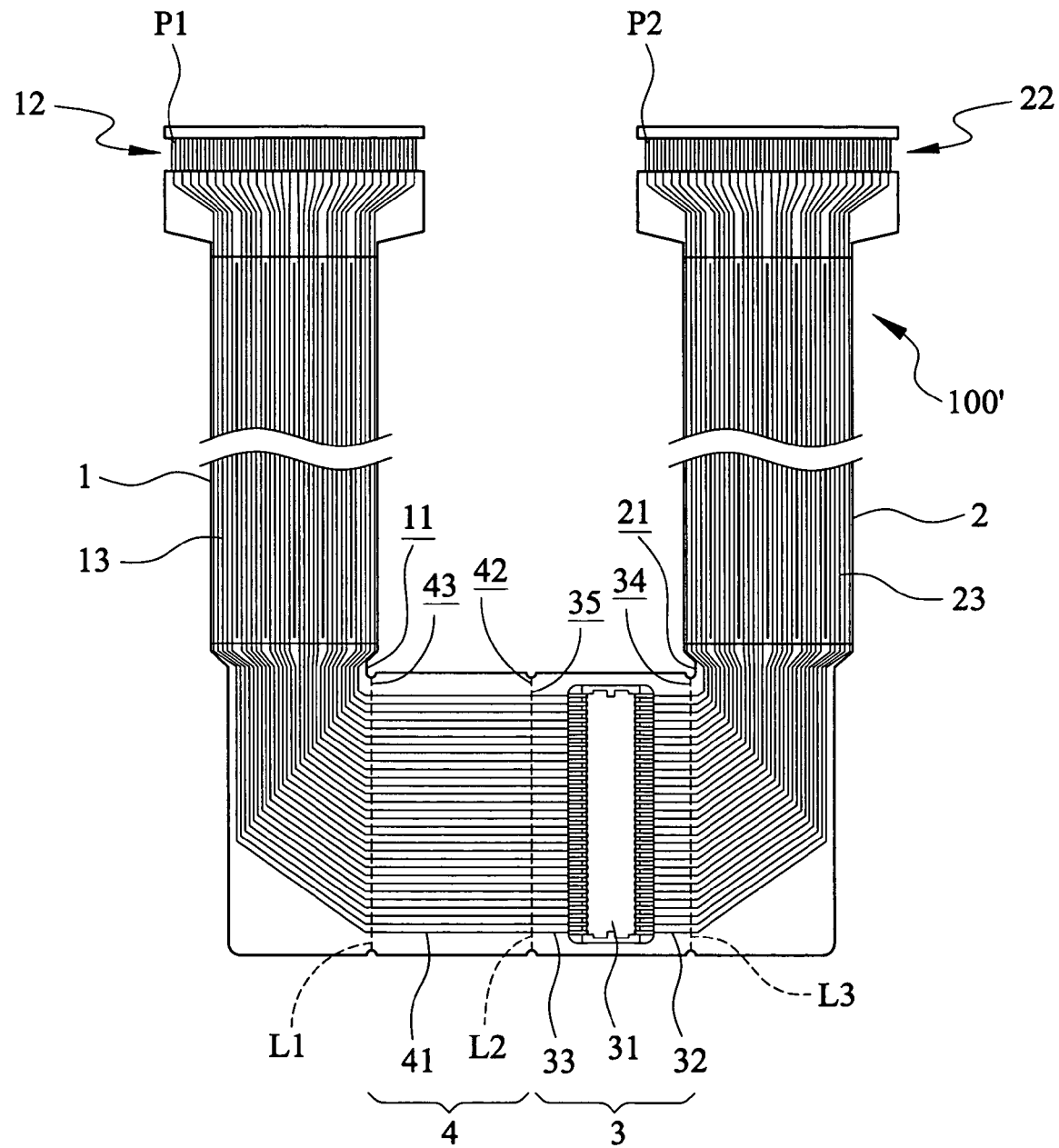
FIG. 14 is a developed plan view of a signal transmission cable with adaptive contact pin reference according to a second embodiment of the present invention.

FIG. 14 is a developed plan view of a signal transmission cable with adaptive contact pin reference 100' according to a second embodiment of the present invention. The cable 100' is structurally similar to the cable 100, except that the component lay-out section 3 and the overlapping section 4 of the cable 100' are adjacent to the second cable 2 and the first cable 1, respectively. Again, the signal transmission cable 100' in the second embodiment may be folded in the same manners used in the first embodiment to change the position of the first cable 1 relative to the second cable 2, and the position of the reference pin P1 relative to the reference pin P2 in the fully folded signal transmission cable 100'.

Figure 15:
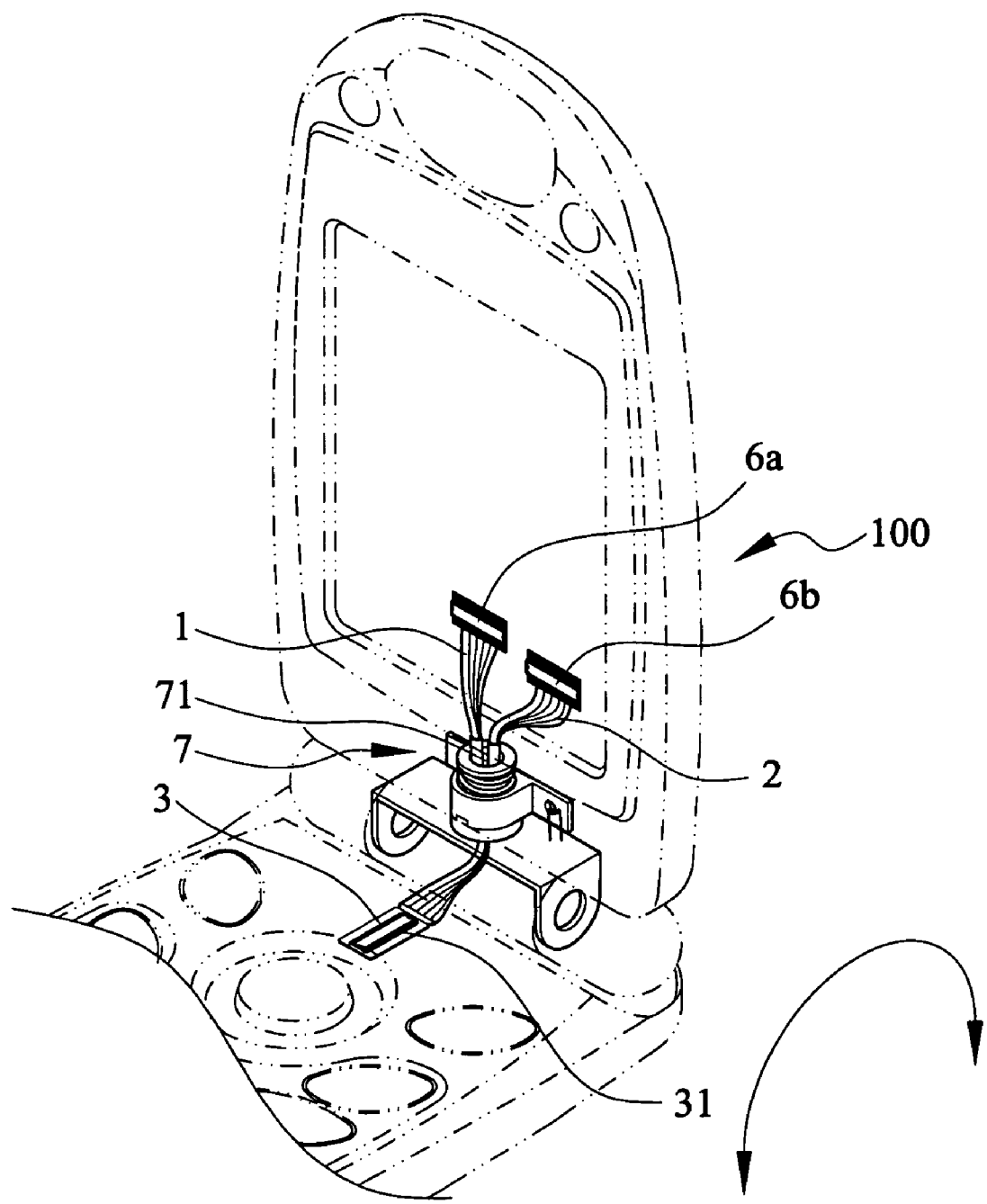
FIG. 15 is a perspective view showing the signal transmission cable of the present invention is extended through a pivoting mechanism on an electronic product.

FIG. 15 shows the cluster section of the signal transmission cable 100, 100' may be easily extended through a hole 71 on a pivoting element 7. Moreover, the signal transmission cable 100, 100' may be connected at the plug terminals 12, 22 to the same one connector or two different connectors, or have first and second cables 1, 2 in different lengths, or be differently folded to change the positions of the reference pins depending on actual need.

Figure 16:
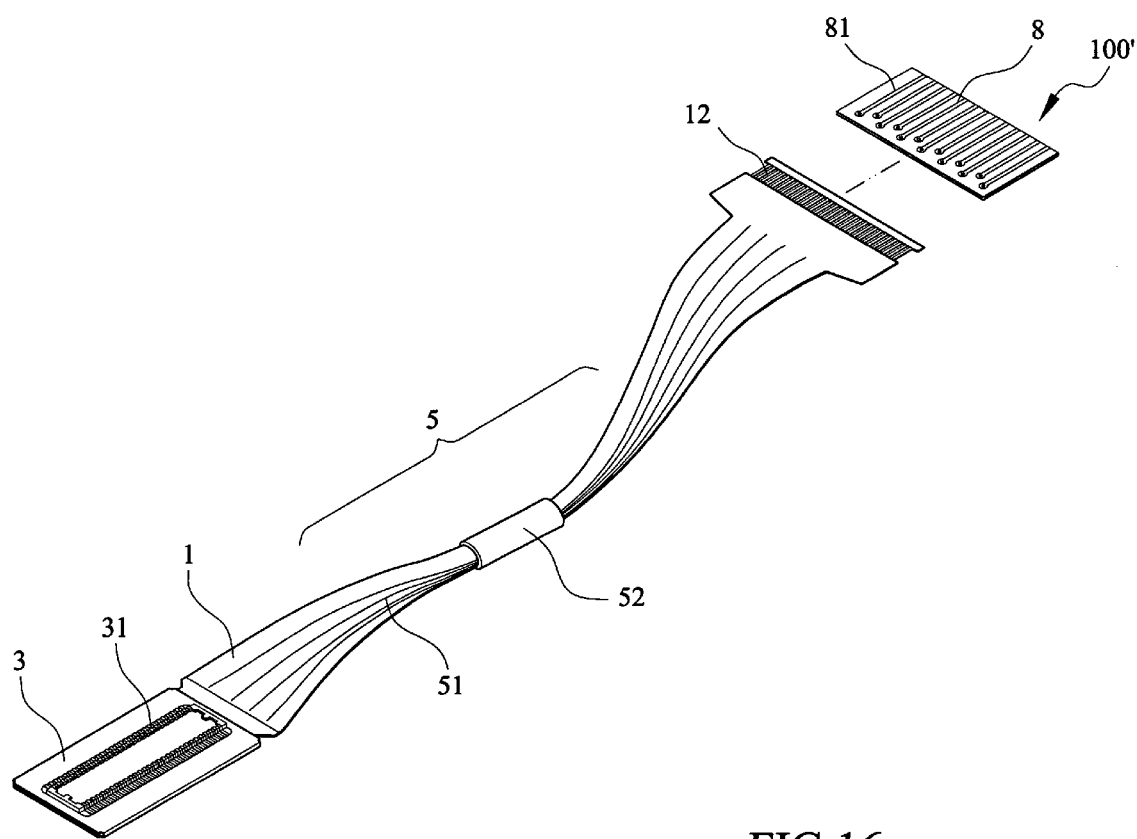
FIG. 16 shows the signal transmission cable of the present invention is connected at a plug terminal to a pin reference exchanged plate.

FIG. 16 shows the signal transmission cable of the present invention may be connected to a pin reference exchanged plate. As shown, when the signal transmission cable 100, 100' has been fully folded to overlap the first cable 1 and the second cable 2, a pin reference exchanged plate 8 may be connected to the plug terminal 12. The pin reference exchanged plate 8 has a plurality of signal circuits 81 arranged thereon using known circuitry techniques. The pin reference exchanged plate 8 may be a single-side board, double-side board, or a multilayer board depending on actual need. With the circuitry provided on the pin reference exchanged plate 8, it is possible to achieve the purpose of jump and change of contact pin reference.

Figure 17:
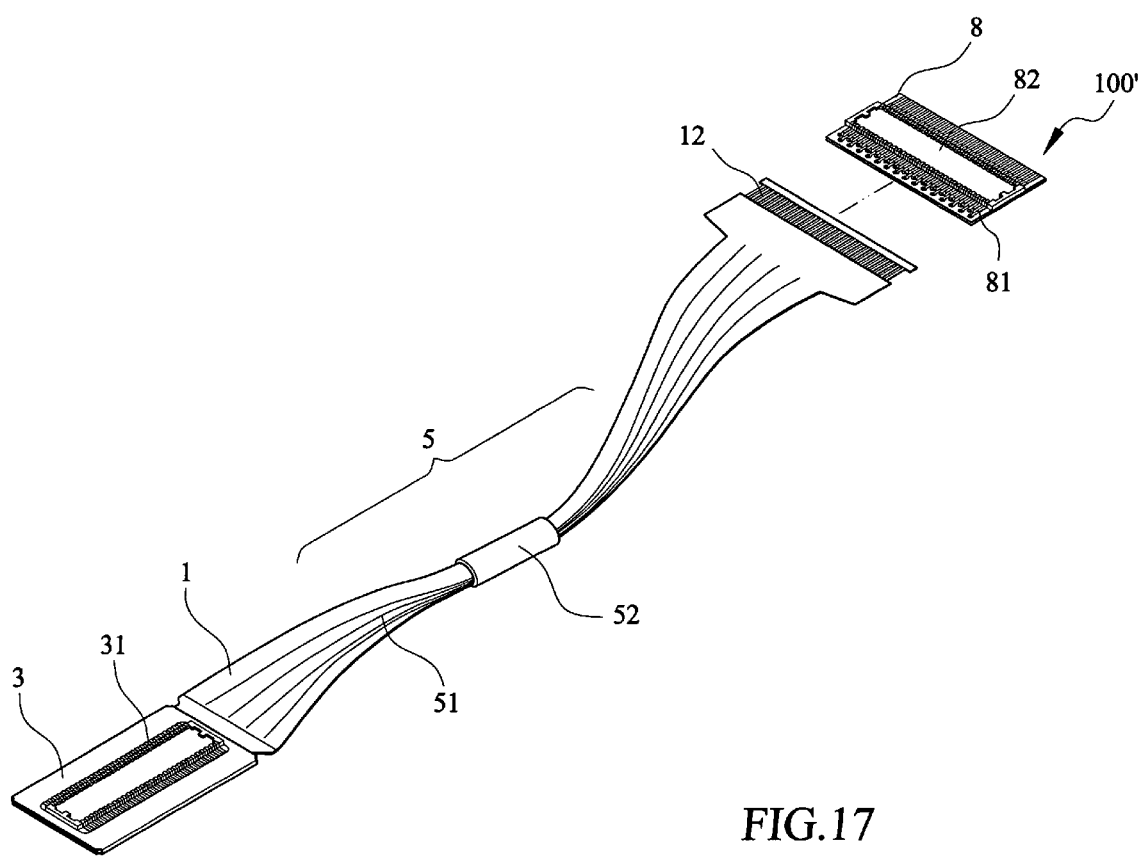
FIG. 17 shows the pin reference exchanged plate of FIG. 16 has a connecting seat provided thereon.

The pin reference exchanged plate 8 shown in FIG. 16 is in a connectable form. Therefore, it is possible to provide other circuit components on the pin reference exchanged plate 8 depending on actual need. For example, in FIG. 17, the pin reference exchanged plate 8 is provided with a connecting seat 82, into which other plug connectors (not shown) may be plugged. Therefore, the signal transmission cable of the present invention is highly flexible for use.

Figure 18:
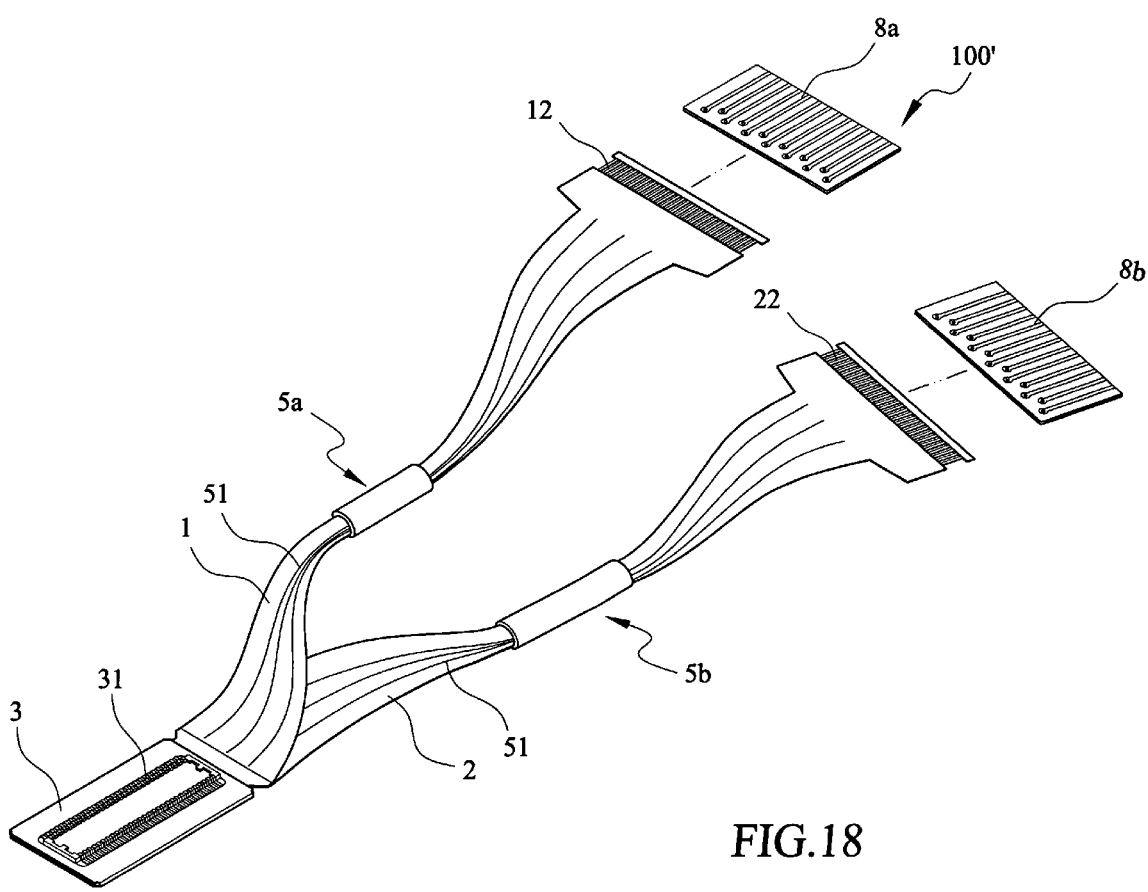
FIG. 18 shows the signal transmission cable of the present invention is connected at two plug terminals to two pin reference exchanged plates.

The plug terminals of the first and the second cable 1, 2 are not necessarily connected to one common pin reference exchanged plate 8. FIG. 18 shows the plug terminals 12, 22 of the first and the second cable 1, 2 are connected to a pin reference exchanged plate 8a and a pin reference exchanged plate 8b, respectively.

The signal transmission cable of the present invention may be applied to many electronic apparatus having a two-axis or a three-axis pivoting mechanism provided thereon, such as mobile phones, portable computers, portable digital video player, etc.

What is claimed is:

1. A signal transmission cable, comprising:
a first cable having a connecting edge and a plug terminal, and including a plurality of signal transmission lines;
a second cable having a connecting edge and a plug terminal, and including a plurality of signal transmission lines;
a component lay-out section having a component connection zone provided on a surface thereof and including a plurality of signal transmission lines; said component lay-out section having a first lateral edge and a second lateral edge, said first lateral edge of said component lay-out section and said connecting edge of said first cable being adjacent to each other with a first folding line formed between them; and said signal transmission lines of said component lay-out section being electrically connected to said signal transmission lines of said first cable; and
an overlapping section including a plurality of signal transmission lines, and having an inner lateral edge and an outer lateral edge; said inner lateral edge of said overlapping section and said second lateral edge of said component lay-out section being adjacent to each other with a second folding line formed between them; and said outer lateral edge of said overlapping section and said connecting edge of said second cable being adjacent to each other with a third folding line formed between them; and said signal transmission line of said overlapping section being correspondingly connected at two ends to said signal transmission lines of said second cable and said component lay-out section.

2. The signal transmission cable as claimed in claim 1, wherein said first cable and said second cable are parallelly extended.

3. The signal transmission cable as claimed in claim 1, wherein said first cable and said second cable have the same length.

4. The signal transmission cable as claimed in claim 1, wherein said first cable and said second cable are different in length.

5. The signal transmission cable as claimed in claim 1, wherein at least one of said first cable and said second cable is connected at said plug terminal to a plug connector.

6. The signal transmission cable as claimed in claim 1, wherein said first cable further includes a cluster section, said cluster section including a plurality of clustered cables, which are formed by cutting said first cable along a plurality of paralleled cutting lines extended in the lengthwise direction of said first cable; and every said clustered cable included in said cluster section being independently freely bendable and internally including at least one signal transmission line.

7. The signal transmission cable as claimed in claim 1, wherein said second cable further includes a cluster section, said cluster section including a plurality of clustered cables, which are formed by cutting said second cable along a plurality of paralleled cutting lines extended in the lengthwise direction of said second cable; and every said clustered cable included in said cluster section being independently freely bendable and internally including at least one signal transmission line.

8. The signal transmission cable as claimed in claim 1, wherein said first cable and said second cable are laid to overlap each other, and said plug terminal of said first cable is connected to a pin reference exchanged plate having a plurality of signal circuits formed thereon.

9. The signal transmission cable as claimed in claim 8, wherein said pin reference exchanged plate has a connecting seat provided thereon.

10. The signal transmission cable as claimed in claim 1, wherein said plug terminals of said first cable and said second cable are connected to a pin reference exchanged plate each, and said pin reference exchanged plates having a plurality of signal circuits formed thereon.

11. The signal transmission cable as claimed in claim 10, wherein each of said pin reference exchanged plates has a connecting seat provided thereon.

* * * * *